United States Patent [19]

Mikkelsen

[11] Patent Number: 5,780,127
[45] Date of Patent: Jul. 14, 1998

[54] WAFER CARRIER

[75] Inventor: Kirk J. Mikkelsen, Chanhassen, Minn.

[73] Assignee: Flouroware, Inc., Chaska, Minn.

[21] Appl. No.: 584,093

[21] Appl. No.:

[22] Filed: Jan. 11, 1996

[22] Filed:

Related U.S. Application Data

[63] Continuation of Ser. No. 275,502, Jul. 15, 1994, abandoned.
[51] Int. Cl.⁶ .................................................. B65D 85/30
[52] U.S. Cl. .................. 428/35.7; 428/34.1; 428/303; 428/367; 428/922; 206/454
[58] Field of Search .................. 428/35.7, 34.1, 428/303, 367, 922; 206/454

[56] References Cited

U.S. PATENT DOCUMENTS 4,669,612  6/1987  Mortensen .......................... 206/454

Primary Examiner—Charles Nold
Attorney, Agent, or Firm—Palmatier, Sjoquist, Voigt & Christensen, P.A.

[57] ABSTRACT

A dimensionally stable and static dissipative carrier for semiconductor wafers or magnetic storage disks that has exceptionally low particle generation characteristics. The carrier having opposing side walls and connecting walls, the side walls having ribs defining slots for axial arrangement of the disks or wafers. The side walls, ribs, and end walls are all integral and formed of injection molded polybutyl terephtahalate (PBT) with sufficient carbon fiber filler for a surface resistivity less than $10^{12}$ ohms per square.

15 Claims, 8 Drawing Sheets

ID CARRIER

This application is a continuation of 08/275,502, Jul. 15, 1994 now abandoned.

This invention relates to the processing, shipping, and storage of semiconductor wafers and magnetic storage disks. More particularly, it relates to a dimensionally stable carrier for wafers and/or disks that is resistant to particle generation.

BACKGROUND OF THE INVENTION

Carriers are utilized for transporting and storing batches of silicon wafers or magnetic disks before during and after processing of the disks or wafers. The wafers are processed into integrated circuits and the disks are processed into magnetic storage disks for computers. The carriers will often be reused several times and then discarded. Between each use the carriers will typically be washed in hot water and/or other chemicals and they are then dried with hot air. It is most important to have a carrier that holds its shape when subjected to the higher temperatures associated with the cleaning, drying, transporting, and processing the carriers.

Carriers are generally configured to axially arrange the wafers or disks in slots, and to support the wafers or disks by their peripheral edges. The wafers or disks are conventionally removable from the carriers in a radial direction upwardly or laterally. Carriers may have supplemental top covers, bottom covers, or enclosures to enclose the wafers or disks. Carriers are typically formed of injection molded plastics such as polycarbonate (PC), acrylonitrile butadiene styrene (ABS), polypropylene (PP), polyethylene (PE), and polyetheretherketone (PEEK).

During processing of wafers or disks, the presence of or generation of particulates presents very significant contamination problems. Contamination is the single biggest cause of yield loss in the semiconductor industry. As the size of integrated circuitry has continued to be reduced the size of particles which can contaminate an integrated circuit has also become smaller making minimization of contaminants all the more critical.

Contaminants in the form of particles may be generated by abrasion such as the rubbing or scraping of the carrier with the wafers or disks, with the carrier covers or enclosures, with storage racks, with other carriers, or with the processing equipment. A most desirable characteristic of a carrier is therefore a resistance to particle generation upon abrasion, rubbing, or scraping of the plastic molded material.

Carriers should also have minimal outgassing of volatile components as these may leave films which also constitutes a contaminant which can damage wafers and disks.

The carriers must have adequate dimensional stability, that is rigidity, when the carrier is loaded. Dimensional stability is necessary to prevent damage to the wafers or disks and to minimize movement of the wafers or disks within the carrier. The tolerances of the slots holding the wafers and disks are typically quite small and any deformation of the carrier can directly damage the highly brittle wafers or can increase the abrasion and thus the particle generation when the wafers or disks are moved into, out of, or within the carrier. Dimensional stability is also extremely important when the carrier is loaded in some direction such as when the carriers are stacked during shipment or when the carriers integrate with processing equipment. The carrier should also maintain its dimensional stability under elevated temperatures which may be encountered during storage or cleaning.

Conventional carriers used in the semiconductor industry may develop and retain static charges. When a charged plastic part comes into contact with an electronic device or processing equipment it may discharge in a damaging phenomena known as electrostatic discharge (ESD). Additionally, statically charged carriers may attract and retain particles, particularly airborne particles. It is most desirable to have a carrier with static dissipation characteristics to eliminate ESD and to avoid attracting particles.

Fillers which have been added to injection molded plastics for static dissipation include carbon powder or fiber, metal fibers, metal coated graphite, and organic (amine-based) additives. To applicant's knowledge, static dissipative polybutyl terephthalate (PBT) has never before been used for wafer or disk carriers.

SUMMARY OF THE INVENTION

Disclosed is a dimensionally stable and static dissipative carrier for semiconductor wafers or magnetic storage disks that has exceptionally low particle generation characteristics. The carrier having opposing side walls and connecting walls, the side walls having ribs defining slots for axial arrangement of the disks or wafers. The sidewalls, ribs, and end walls are all integral and formed of injection molded polybutyl terephthalate (PBT) with 12 percent to 25 percent carbon fiber filler by weight. The preferred embodiment utilizes standard chopped carbon fiber which generally has an aspect ratio much greater than 100:1 before compounding.

An advantage of the invention is that the carrier has very high abrasion resistance and very low particle generation when rubbed or abraded with materials typically encountered by carriers.

A feature and advantage of the invention is that the carrier has a surface resistivity in the range of $10^5$ to $10^{12}$ ohms/square resulting in a static dissipative carrier whereby any static charge is safely dissipated. The dissipation minimizes the potential for electrostatic discharges and eliminates or reduces the tendency of the carrier to attract particles.

An advantage of the invention is that the cost is significantly less than the only other carrier offering comparable dimensional stability, abrasion resistance, and static dissipative characteristics. The only comparable carrier known to the applicant which has similar abrasion resistance, low particle generation characteristics, and similar dimensional stability is a carrier formed of carbon fiber filled PEEK. Such a PEEK carrier is several times as expensive to manufacture as the instant invention.

An advantage of the invention is that the carriers have significantly improved temperature capabilities especially when compared to the most commonly used carrier materials such as polypropylene. That is, the carrier maintains its favorable dimensional stability characteristics at temperatures significantly higher than carriers made of unfilled PBT or of PP with carbon fibers.

DETAILED DESCRIPTION OF THE PREFERRED EMBODIMENTS

Figure 1:
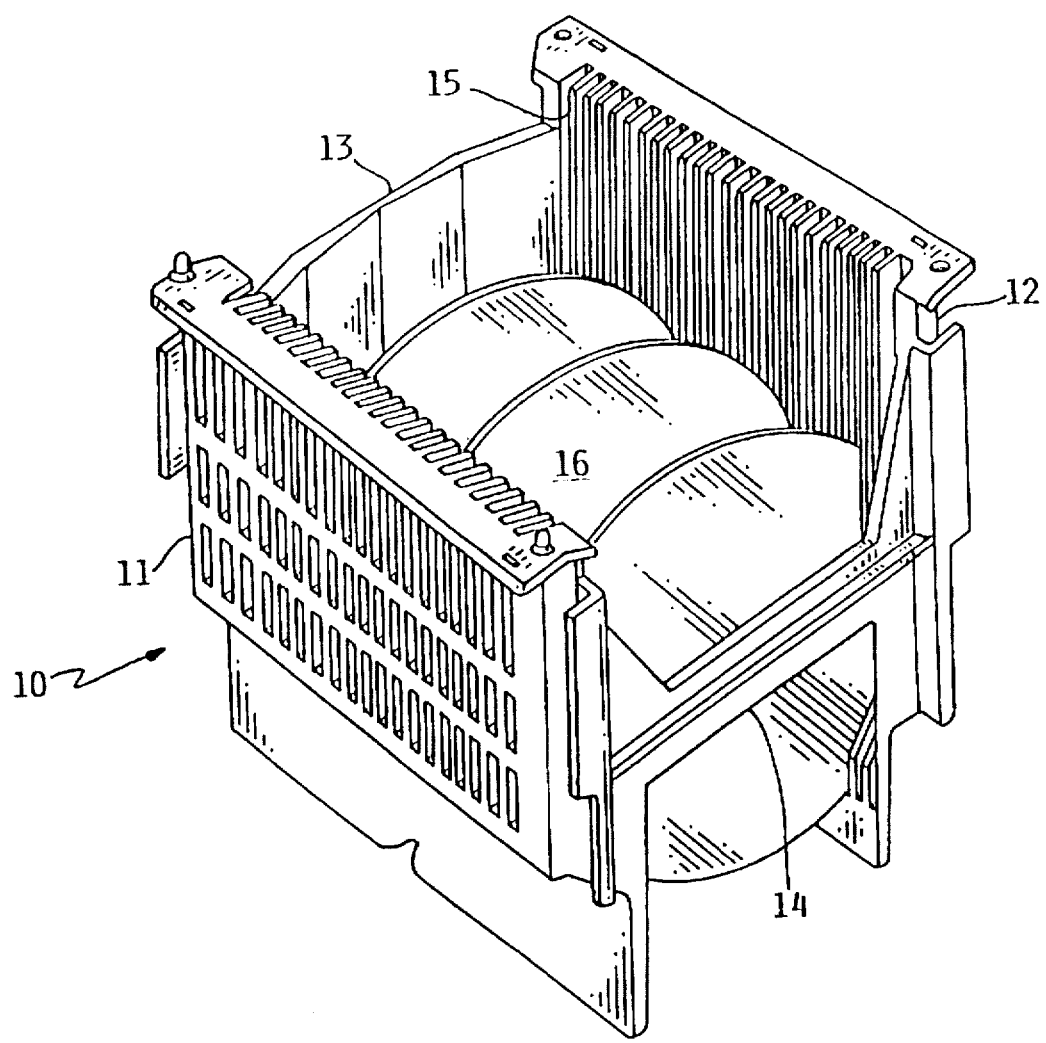
FIG. 1 shows a carrier for semiconductor wafers.
Figure 2:
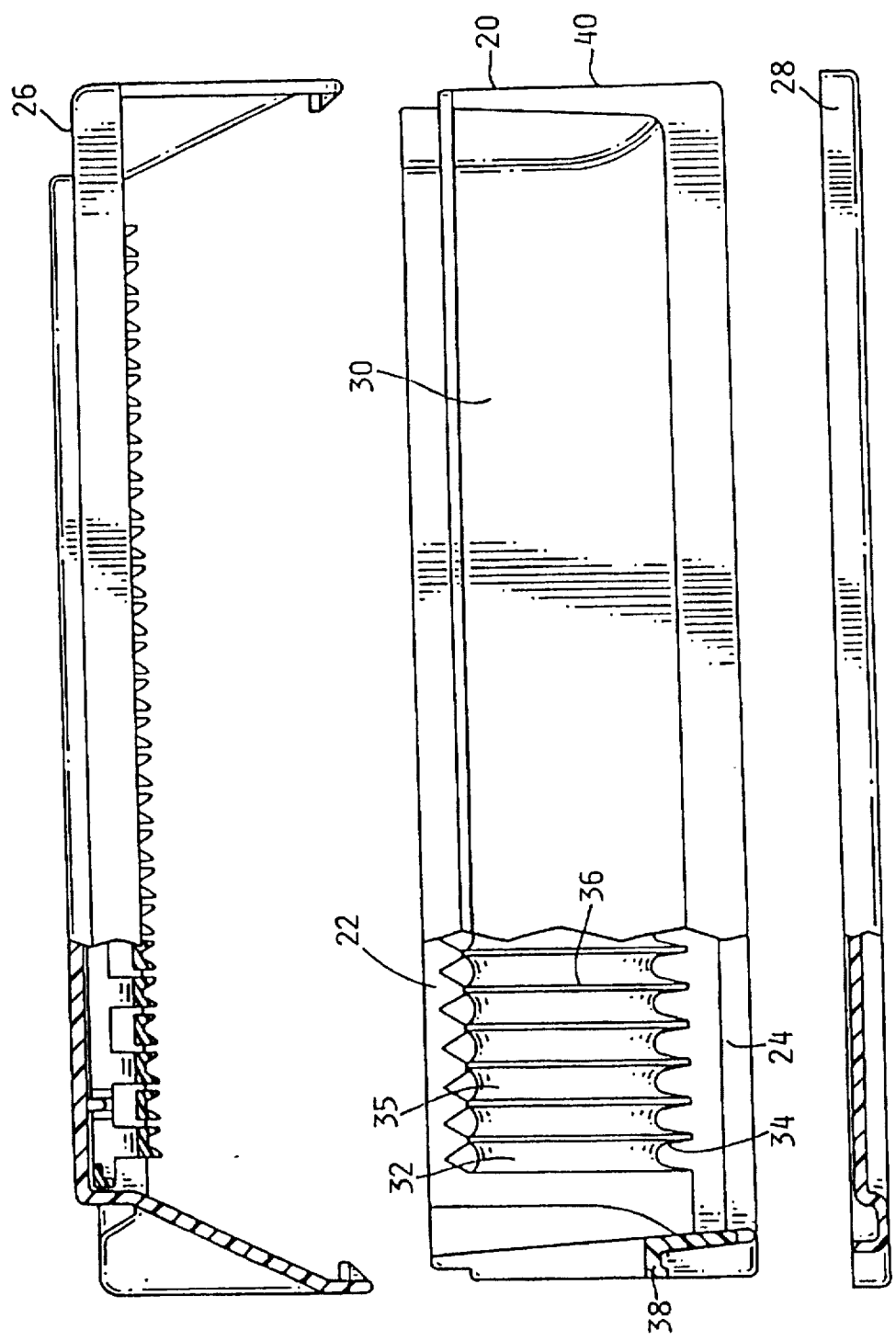
FIG. 2 shows a three part shipper carrier suitable for shipping magnetic disks.

Referring to FIGS. 1 and 2, two different embodiments of wafer and/or disk carriers are depicted. The wafer carrier 10, shown in FIG. 1, is a rather typically configured carrier which has sidewalls 11, 12 and connecting walls 13, 14. The sidewalls 11, 12 have slots 15 sized for receiving and engaging the wafers 16.

FIG. 2 is a three-piece shipper carrier generally used for disks that are processed into magnetic storage disks for computers. This three-piece shipper has the configuration shown in U.S. Pat. No. 5,253,755 issued to Dale Maenke. The carrier is comprised of a main body portion 20 with an open top 22 and an open body bottom 24. A cover 24 engages the body portion 20 to close the open top 22. A bottom cover 28 engages the main body portion 20 and closes the open bottom 24. The main body portion 20 has sidewalls 30, 32 which have slots 34 defined by ribs 35 for holding the disks 36 connecting walls 38, 40 connecting to sidewalls 30,32. This type of shipper is primarily used for shipping disks in between the processing of the disks and for shipping from the processing to the hard disk manufacturers. When used herein, "wafers" is defined to include, in addition to semiconductor wafers, disks for computer memory drives and similar substrates.

Figure 3:
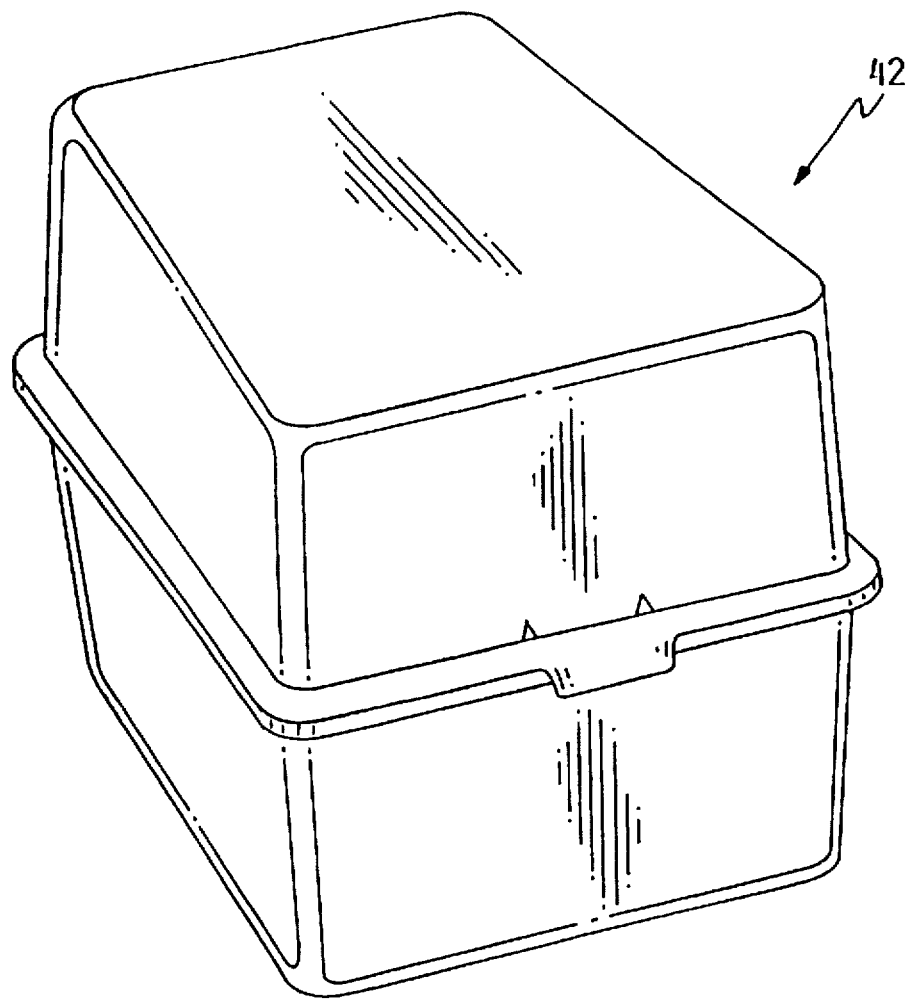
FIG. 3 depicts an enclosure as part of a carrier which holds a body portion such as shown in FIG. 1.

FIG. 3 depicts an openable enclosure 42 for enclosing carrier body portions such as shown in FIG. 1.

Various other configurations of carriers are utilized for shipping and processing in both the semiconductor wafer industry and in the disk industry. The numerous configurations of carriers will not be individually identified or described, however, for the purposes of this application, "carriers" is defined to include any such carriers for shipping, processing, or storage having sidewalls with slots for restraining and engaging the wafers and end walls connecting the sidewalls. As defined herein, "carriers" can also have the top covers and bottom covers, as shown in FIG. 2, or full enclosures for insertion and total enclosure of a body portion. "Carriers" would thus include top covers, bottom covers, and enclosures.

Various plastics are known for use in manufacturing carriers such as described above. Plastics that are known to have been used in carriers include polypropylene (PP), polycarbonate (PC), polyethylene (PE), polyetheretherketone (PEEK), and polybutyl terephthalate (PBT).

As integrated circuitry has gotten smaller and storage capacities on disks has gotten larger, the susceptibility of the wafers and disks to damage from particles and static discharges has increased proportionately. It is of utmost importance to minimize any particle generation which may contaminate the wafers or disks. Particle generation is not a characteristic that has standardized testing or published tables of data for various plastics. It has generally been thought in the industry that the plastics which are generally very durable and wear resistant would similarly provide the best characteristics for wafer carriers insofar as particle generation and dimensional stability. For example, the nylons and related plastics and acetal, have such characteristics. However, carriers made from these materials have unfavorable water absorption characteristics which adversely affect the dimensional stability. Polybutyl terephthalate (PBT) is not generally considered a premier wear-resistant plastic and presumably then not a minimal particle generating plastic.

Pure plastics are normally insulative with a resistance of greater than $10^{12}$ ohms/sq. For the methodology and explanation of surface resistivity, see ASTM Standard D257-78 available from American Society for Testing & Materials, 1916 Race Street, Philadelphia, Pa. 19103. The static dissipative range is generally considered to be $10^5$–$10^{12}$ ohms/sq. Known prior art carriers that have been made with static-dissipative additives are polycarbonate (PC), polyethylene (PE), polypropylene (PP) and polyetheretherketone (PEEK). Although the use of PBT in carriers is known, there has been no use known to the applicant of a PBT carrier with additives to create a static dissipative carrier.

The percentage of dissipative additives has a direct correlation to the static-dissipative characteristics of the final product. The additives that are generally available for reducing the surface resistivity of plastic are principally carbon powder, carbon fiber, ceramic materials, and amine. Carbon additives can be in the form of carbon powder or carbon fiber. Carbon fiber can be added as a filler in the form either milled carbon fiber or standard chopped carbon fiber. Milled carbon fiber has a wide variety of lengths and aspect ratios (length:diameter), chopped carbon fiber has a high proportion of fibers with observed aspect ratios of generally 50:1–100:1. The proportion of carbon, whether it be in the form of fiber or carbon powder, results in a significant impact on the particle generation characteristics of carriers formed of PBT, especially the use of chopped carbon fiber.

The invention is comprised of a carrier such as shown in FIGS. 1 and 2, with a base material of PBT with an additive of chopped carbon fiber in the proportion of 12–25% by weight of the PBT. Use of this proportion of carbon fiber results in surface resistance within the static dissipative range. This particular design has demonstrated unexpected and extraordinarily low particle generation as indicated by air particle counts and wafer photo particle counts, exceptionally low abrasion characteristics, and exceptional dimensional stability. The following examples and the associated figures demonstrate the surprising and unexpected characteristics of the invention. These examples discuss simulations of the type of conditions to which carriers are exposed. The various examples utilize carriers molded of various plastics shown in the following chart.

| CARRIERS ON CHARTS | | |
|---|---|---|
| Carrier Designation | Filler | Base Material |
| PP 50% | ~50% Anti-static Ceramic | Polypropylene |
| PP 15% MF | ~15% Milled Carbon Fiber | Polypropylene |
| PEEK 15% MF | ~15% Milled Carbon Fiber | Polyetheretherketone |
| PBT 15% CCF | ~15% Standard Chopped Carbon Fiber | Polybutyl terephthalate |
| PP 15% MCF | ~15% Milled Carbon Fiber | Polypropylene homopolymer |
| PP 28% MCF | ~28% Milled Carbon Fiber | Polypropylene random copolymer |
| PP 15% CCF | ~15% Standard Chopped Carbon Fiber | Polypropylene homopolymer |
| PI %C | ~unknown carbon | Polyimide |
| PEKK 15% MCF | ~15% Milled Carbon Fiber | Polyetherketone-ketone |

CARRIERS ON CHARTS

| Carrier Designation | Filler | Base Material |
|---|---|---|
| PEEK 15% MCF w/PTFE | ~15% Milled Carbon Fiber/?% PTFE | Polyetheretherketone |
| PB 15% MCF | ~15% Milled Carbon Fiber | Polybutyleneterephthalate |
| PE 15% MCF | ~15% Milled Carbon Fiber | Polyethylene |
| PC 15% CCF | ~15% Standard Chopped Carbon Fiber | Polycarbonate |
| PP | ~No Filler | Polypropylene |
| PB 19% CCF | ~19% Standard Chopped Carbon Fiber | Polybutyleneterephthalate |
| PFA | | Perfluoroalkoxy polytetrafluoroethylene copolymer |

Example 1

Figure 4:
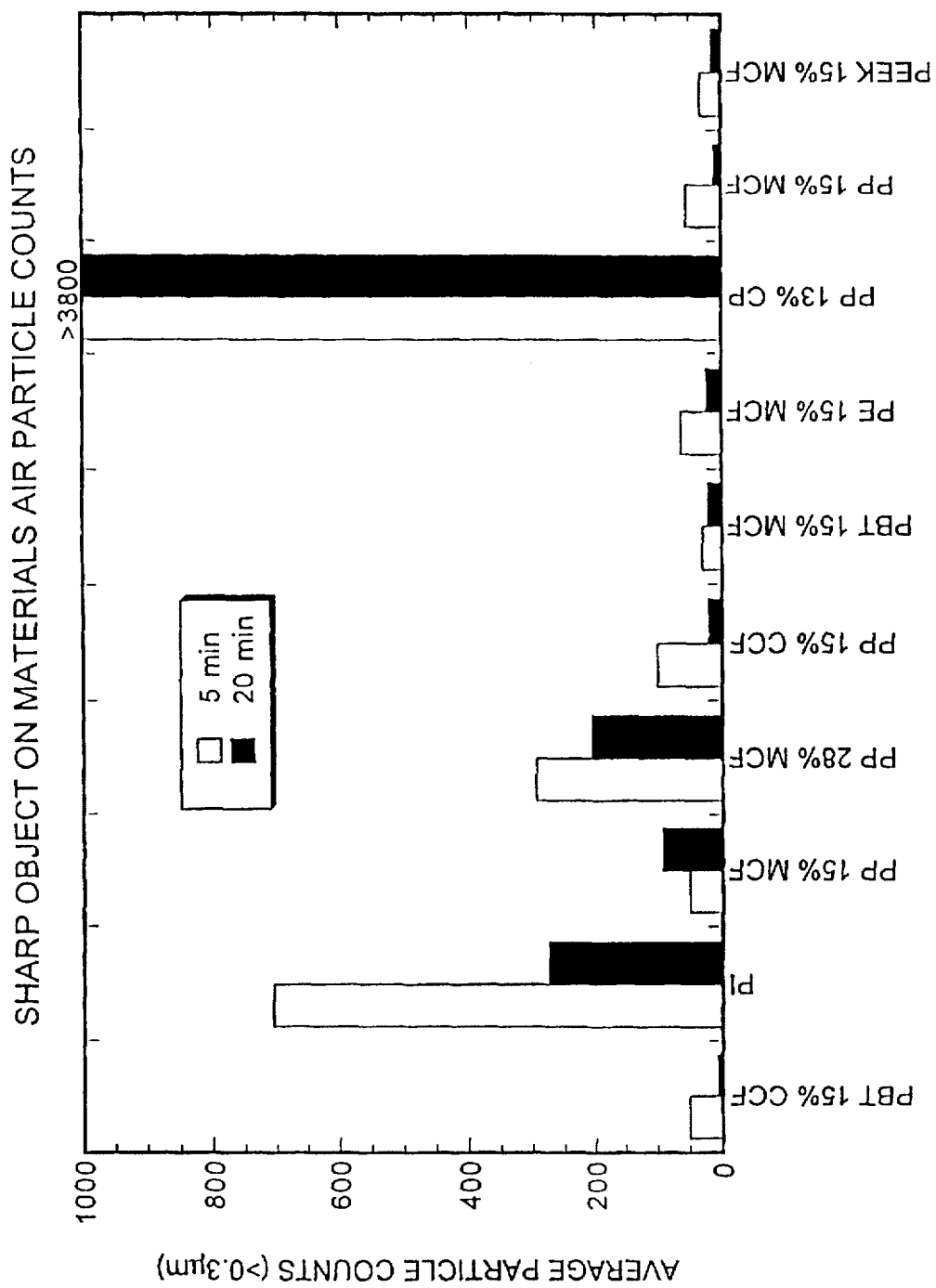
FIG. 4 is a chart showing the particle generation of various carriers, by way of air particle counts.

Referring to FIG. 4, this bar chart shows various carriers tested to determine particle generation by way of sustained moving contact between the carrier material and a sharp object. A 1/16 inch stainless steel pin with a 45° taper to a 1/64 inch radius was allowed to rest upon a rotating disk cut from the carriers tested. The disk rotated at approximately 70 RPM and particle counts were taken from 0 to 5 minutes and 5 to 10 minutes. Generally 3-7 samples were cut from each of the different carriers. The carriers that were demonstrated to have generally the lowest air particle counts were the PBT with 15% chopped carbon fiber, the PBT with 15% milled carbon fiber, the polyethylene with 15% milled carbon fiber, the polypropylene with 50% ceramic conductive material and the PEEK with 15% milled carbon fiber. The polypropylene carrier with 15% chopped carbon fiber performed well, but not nearly as well as the claimed invention, the PBT carrier with 15% chopped carbon fiber.

The best performing material in this test was the PEEK carrier with 15% milled carbon fiber. As described below, the PEEK carrier is several times as expensive as any of the other carriers, including the PBT carriers with carbon fiber.

Example 2

Figure 5:
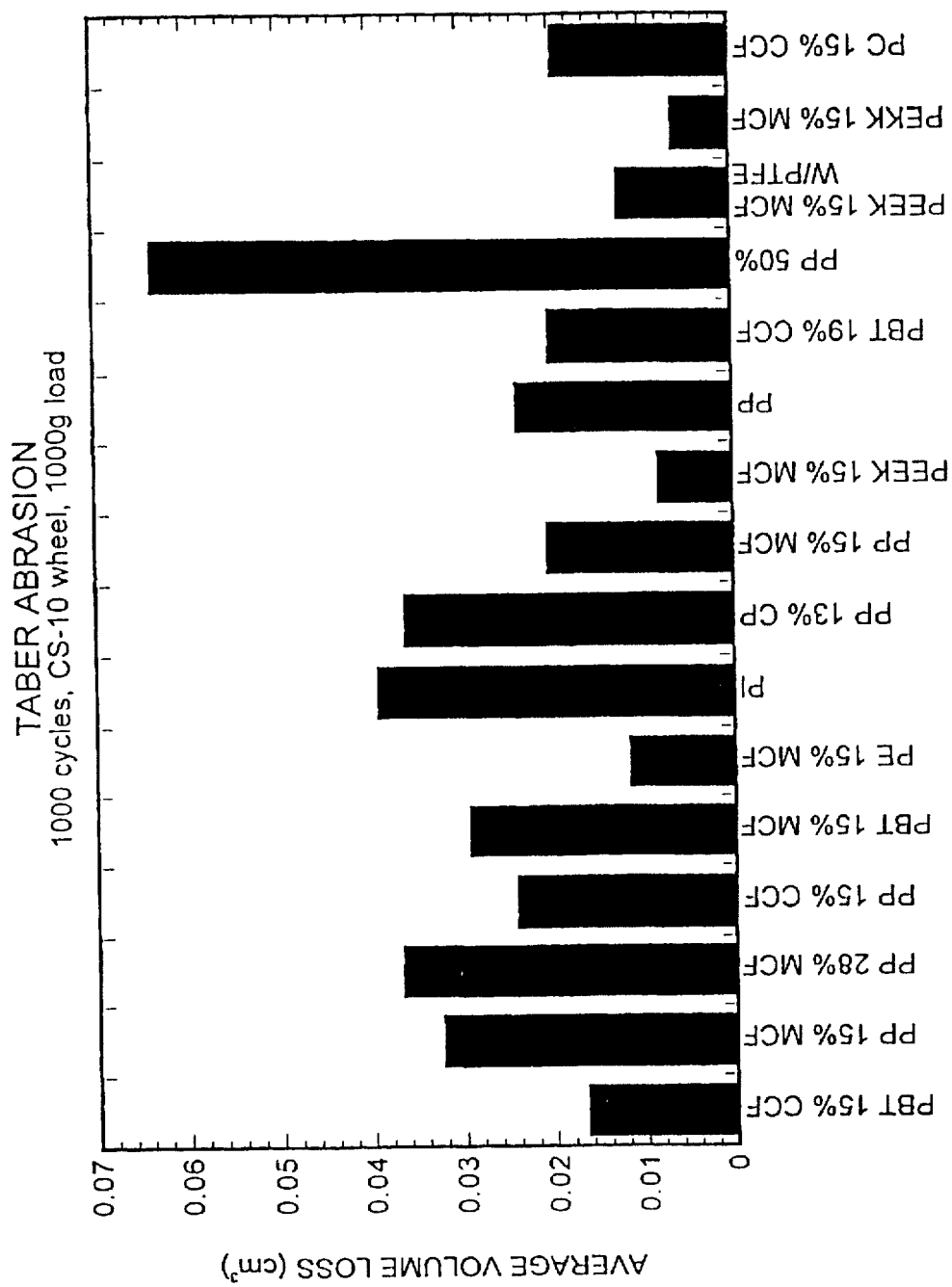
FIG. 5 is a chart showing the abrasion resistance of various carriers.

Referring to FIG. 5, various carriers were subjected to a Taber abrasion test utilizing a standard Taber abrasor apparatus operated in accordance with industry custom and with reference to ASTM Standard 1044 available from ASTM. The test samples were cut from the various carriers and were subject to 1000 cycles with a CS-10 abrasion wheel and a 1,000 gram load. The abrasion wheel engages the rotating test sample and is skewed to the rotation of the test disk to produce a rubbing or abrasion on the disk. The abrasion tendency of the test samples from the carriers as indicated by volumetric loss was determined by measuring the weight loss of the samples. This test did not show the number of particles generated, but rather demonstrated the volumetric quantity of particles generated presuming that volume lost on the test samples was due to the abrasion of particles off the samples. The seven carriers that demonstrated the least amount of volumetric loss were the carriers formed of PBT with 15% chopped carbon fiber, the polyethylene with 15% milled carbon fiber, the polypropylene carrier with 15% milled carbon fiber, the PEEK carrier with 15% milled carbon fiber, the PBT carrier with 19% chopped fiber, the PEEK carrier with 15% milled carbon fiber along with a low percentage of PTFE, the PEEK carrier with 15% milled carbon fiber, and the polycarbonate carrier with 15% chopped carbon fiber.

Example 3

Figure 6:
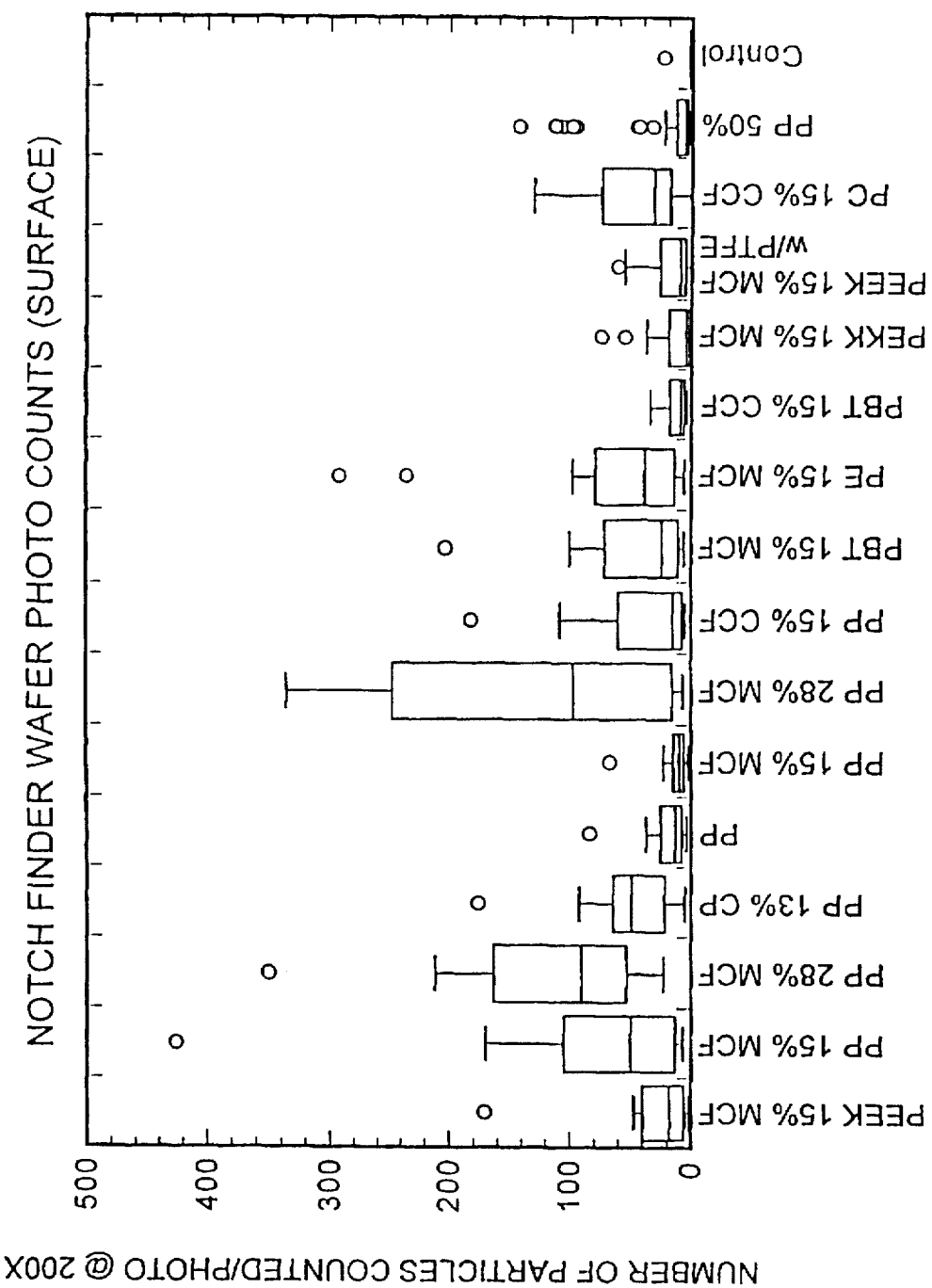
FIG. 6 a chart showing particle generation by way of photo counts for various carriers.

Referring to FIG. 6, this figure is a chart showing the results of particle generation as evidenced by photo counts on the surface of a disk that is rotated within the various carriers. The carriers are positioned with the slots vertical and thus the wafers vertical. This rotation simulates the rotation of wafers within carriers that occurs during the processing of wafers to properly align the wafers. The carriers that demonstrated the best performance as indicated by the number of particles counted were the carrier made of PEEK with 15% milled carbon fiber, the polypropylene carrier with 15% milled carbon fiber, the PBT carrier with 15% chopped carbon fiber, the PEEK carrier with 15% milled carbon fiber, the PEEK with 15% milled carbon fiber with a low percentage of PTFE, and the polypropylene carrier with 15% anti-static ceramic material. For this test, two disks were tested in at least two separate carriers and four photo counts were made of each wafer resulting in a minimum sample size of sixteen for each type of carrier. The polypropylene with 15% ceramic material was tested numerous additional times, explaining the eight statistical outlying points shown on the chart. This is a very realistic test in that it involves the wafers rotating within the carrier as is done in actual use. Additionally, the photo counts were taken on the surface of the disk where contamination can be a significant problem.

Example 4

Figure 7:
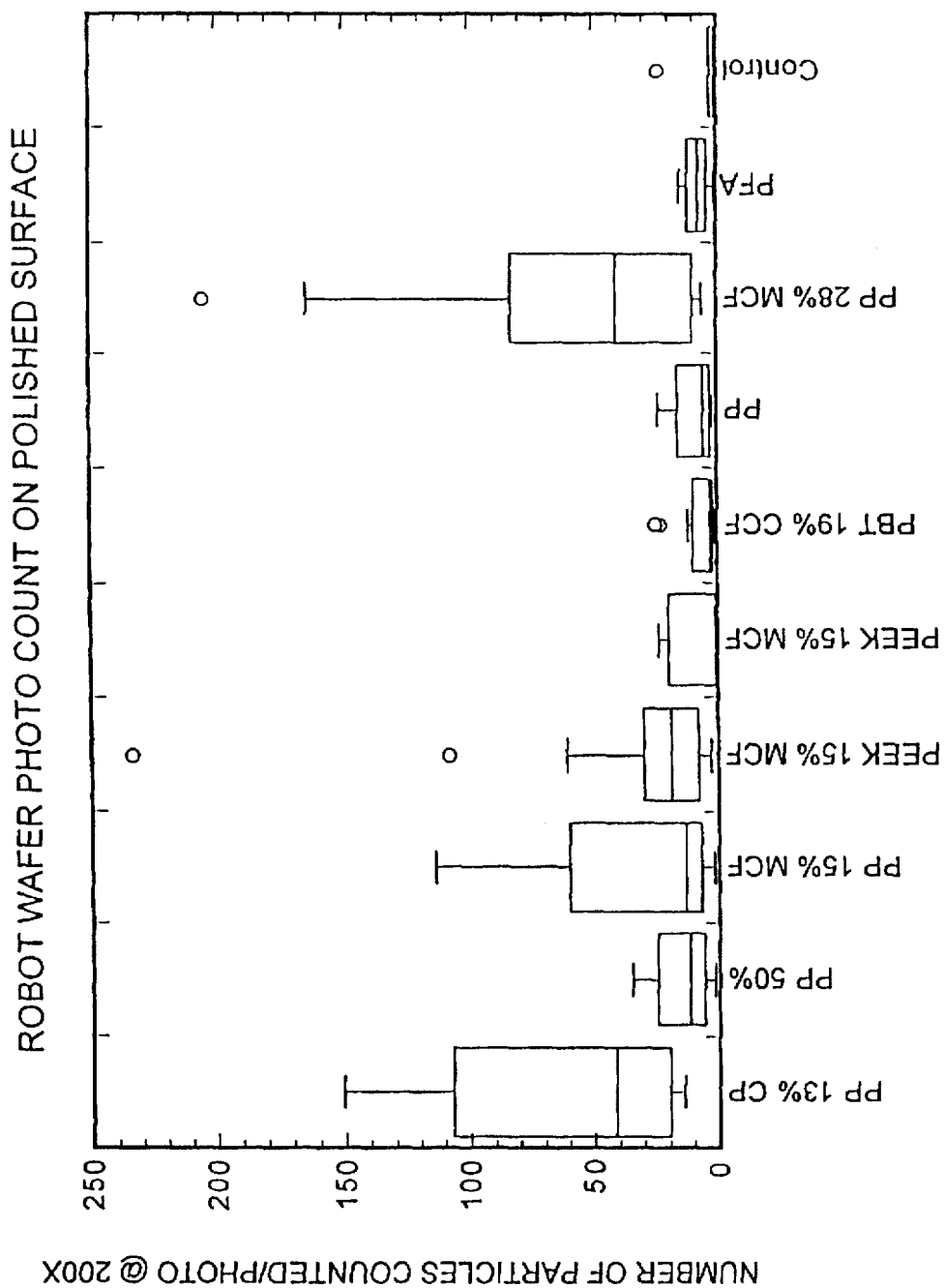
FIG. 7 is a chart showing particle generation as measured by photo counts, resulting from insertion and retraction of wafers in various carriers.

Referring to FIG. 7, this figure shows a chart demonstrating the results of a test of various carriers in which the carrier was positioned so that the slots and disks were horizontal and a robot repeatedly inserted and removed a disk in a particular slot in the carriers. A photo count of the particles was then made on the top surface of the wafer. The invention had the best performance in this test with the nearest competitor being a carrier made from a perfluoroalkoxy polytetrafluoroethylene copolymer (PFA) that does not have static dissipative characteristics. This is a significant test in that it simulates the actual insertion and removal of wafers from carriers that is done in processing. Conventional static dissipative carriers of polypropylene and even the much more expensive material PEEK do not perform nearly as well as the subject invention in this test.

Example 5

Figure 8:
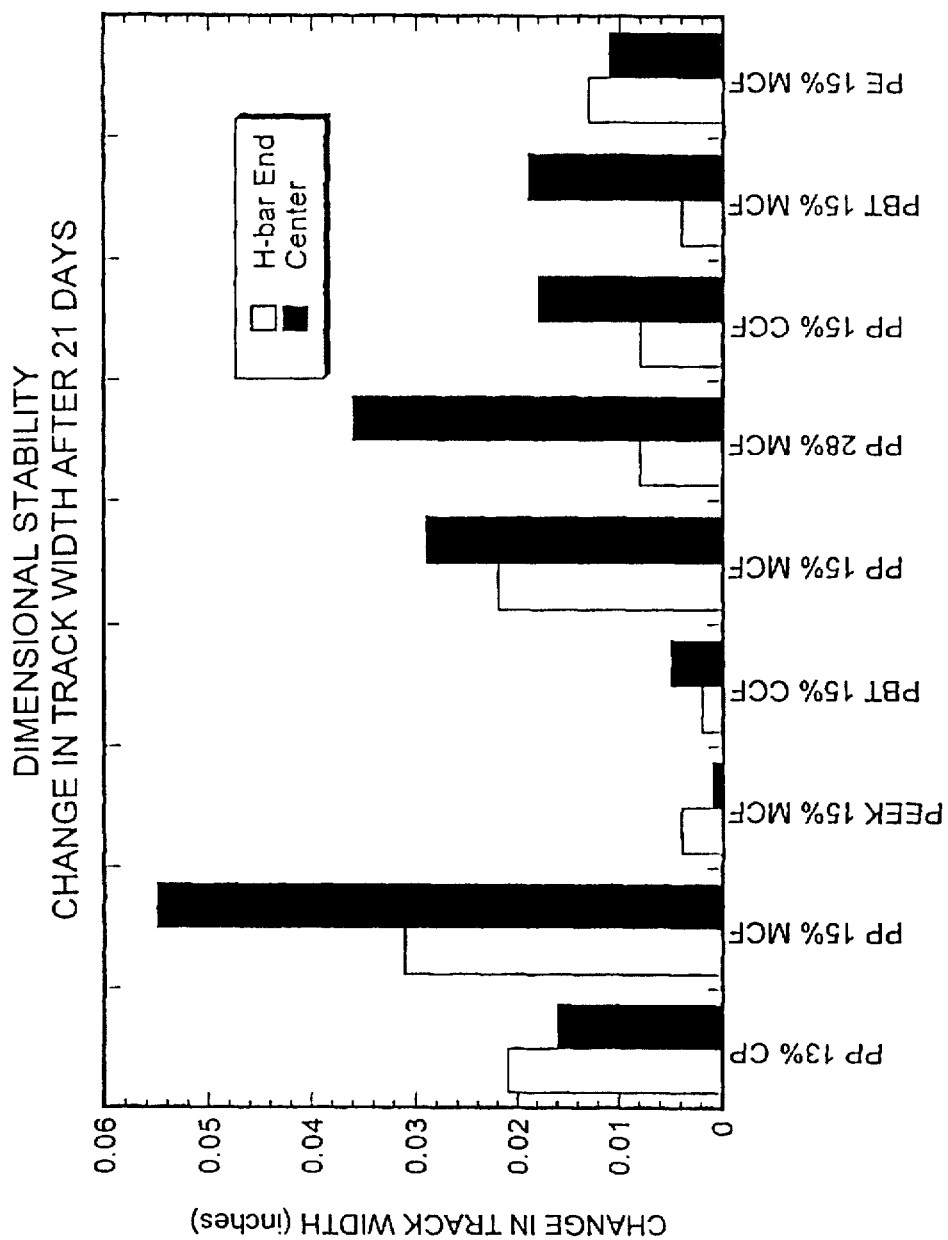
FIG. 8 shows the dimensional stability of various carriers.

Referring to FIG. 8, this chart shows the results of a test designed to show the dimensional stability of the various carriers after being subjected to loading for a sustained period of time, specifically, 21 days. The test was performed with carriers such as shown in FIG. 1 set at an oblique angle on a flat surface with a weight bearing down on the sidewall which is facing upwardly at an oblique angle. The two best performers by far were the subject invention, that is, the carrier with 15% chopped carbon fiber, and the carrier made of PEEK with 15% milled carbon fiber. Significantly, the worst carriers were the polypropylene based carriers.

The advantages of the PBT carrier with the chopped carbon fiber are accentuated by cost comparisons to other carriers. Estimated prices for a 200 mm carrier of the general configuration as shown in FIG. 1 would be as follows: For the polypropylene with no carbon filler and for the polypropylene with 13% carbon powder, the estimated price is $20-30. The estimated cost for the same carrier for the polypropylene with 15% milled carbon fiber, 58 the polypropylene with 28% milled carbon fiber, 58 and the polypropylene with 15% chopped carbon fiber are all slightly higher.

The carrier made from PEEK with 15% milled carbon fiber has an estimated cost as much as ten times higher than the polypropylene carriers with no carbon filler or with carbon powder. The subject carrier with 15–25% carbon fiber has an estimated price comparable to the polypropylene static dissipative carriers.

In addition to the characteristics exemplified by the above examples, it should be noted that polyethylene and acetal have unfavorable outgassing characteristics. PBT with or without carbon filler is known to have favorable (very low) outgassing characteristics. PBT with carbon filler has very good dimensional stability at elevated temperatures. PBT as previously used in carriers without carbon filler has significantly less dimensional stability at elevated temperatures. Polyethylene with or without carbon fillers has quite poor dimensional stability at elevated temperatures which may be encountered in shipping or processing.

Thus, the invention of a static dissipative wafer carrier formed of PBT with carbon fiber filler provides extraordinary and unanticipated favorable particle generation characteristics, dimensional stability, temperature stability, and low outgassing. The only known comparable carrier is a carrier made from PEEK with milled carbon fiber which costs approximately four times as much to manufacture as the subject invention.

When used herein, 'disks' refers to both wafers and disks. The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A dimensionally stable and low particle generating wafer carrier comprising injection molded polybutyl terephthalate and carbon fiber filler, further comprising a pair of side walls, a pair of end walls joining the sidewalls, a plurality of slots formed in the sidewalls for holding wafers and wherein the sidewalls and the end walls are all integral, with carbon fibers sufficient for a surface resistivity of less than $10^{12}$ ohms per square.

2. The carrier of claim 1 wherein the proportion of the carbon fibers in the carrier is in the range of 12–25% by weight.

3. The wafer carrier of claim 1 further comprising a pair of side walls with ribs, a pair of connecting walls, the ribs defining a plurality of slots, and wherein the side walls, the end walls, and the ribs are all integral.

4. The carrier of claim 3, wherein the side walls, the connecting walls, and the ribs are part of a main body portion, wherein the main body portion has an open top, and wherein the wafer carrier further comprises a cover for the open top.

5. The wafer carrier of claim 3, wherein the side walls, the connecting walls, and the ribs are part of a main body portion, wherein the main body portion has an open bottom and the wafer carrier further comprises a bottom cover for the open bottom.

6. The wafer carrier of claim 1 further comprising an elastomeric polyester.

7. The wafer carrier of claim 3, wherein the sidewalls and the end walls are part of a main body portion, and the carrier further comprises an openable enclosure made of polybutyl terephthalate with carbon fibers wherein the proportion of the carbon fibers in the carrier is in the range of 12 to 25% by weight.

8. A dimensionally stable and low particle generating injection molded wafer carrier having at least one slot for holding a wafer or a disk, the carrier formed of polybutyl terephthalate filled with carbon fibers, with carbon fibers sufficient for a surface resistivity of less than $10^{12}$ ohms per square.

9. The carrier of claim 8, wherein the carbon fibers are chopped carbon fibers.

10. The carrier of claim 8 further comprising a pair of side walls, a pair of end walls joining the sidewalls, a plurality of slots formed in the sidewalls, and wherein the sidewalls and the end walls are all integral.

11. The carrier of claim 10, wherein the side walls and the end walls are part of a main body portion, wherein the main body portion has an open top, and wherein the wafer carrier further comprises a cover for the open top.

12. The carrier of claim 10, wherein the side walls, the connecting walls, and the ribs are part of a main body portion, wherein the main body portion has an open bottom and the wafer carrier further comprises a bottom cover for the open bottom.

13. The carrier of claim 10, wherein the sidewalls and the end walls are part of a main body portion, and the carrier further comprises an openable enclosure made of polybutyl terephthalate with carbon fibers sufficient for a surface resistivity of less than $10^{12}$ ohms per square and wherein the enclosure is sized for receiving the main body portion.

14. The wafer carrier of claim 10, wherein the polybutyl terephthalate has an elastomeric polyester additive.

15. The wafer carrier of claim 1, wherein the carbon fibers are and the majority of fibers have an aspect ratio of greater than 100:1 before compounding.

* * * * *